US006054395A

United States Patent [19]

Knappenberger

[11] Patent Number: 6,054,395

[45] Date of Patent: Apr. 25, 2000

[54] METHOD OF PATTERNING A SEMICONDUCTOR DEVICE

[75] Inventor: Eric Knappenberger, Boise, Id.

[73] Assignee: Micron Technology, Inc., Boise, Id.

[21] Appl. No.: 08/957,210

[22] Filed: Oct. 24, 1997

[51] Int. Cl.[7] .................... H01L 21/205

[52] U.S. Cl. .................... 438/758; 438/20; 438/780; 438/942; 438/22; 313/309; 313/311; 445/50; 118/300

[58] Field of Search .................... 438/20, 758, 780, 438/942, 22; 313/309, 311; 445/50, 51; 118/300, 620

[56] References Cited

U.S. PATENT DOCUMENTS

| | | | |
|---|---|---|---|
| 4,801,411 | 1/1989 | Wellinghoff et al. | 264/9 |
| 5,194,297 | 3/1993 | Scheer et al. | 427/180 |
| 5,559,057 | 9/1996 | Goldstein | 437/228 |
| 5,681,196 | 10/1997 | Jin et al. | 445/24 |
| 5,695,658 | 12/1997 | Alwan | 216/42 |
| 5,808,401 | 9/1998 | Jin et al. | 313/309 |

*Primary Examiner*—Charles Bowers
*Assistant Examiner*—Renzo N. Rocchegiani
*Attorney, Agent, or Firm*—Trop, Pruner, Hu & Miles, P.C.

[57] ABSTRACT

A method for forming semiconductor devices involves nebulizing a liquid suspension of particles to form tiny droplets of particles and liquid which are well separated from one another. The nebulized droplets may correspond roughly to the average particle size which may be, for example, about one to two microns. The particles in droplet form then form a vaporous dispersion which can be dried to remove the liquid. The particles may be biased so as to repel one another to further form a well defined separation between adjacent particles. The particles may then be collected on a substrate so that a random distribution of masking particles are formed. The randomly distributed particles may be used as a mask for defining features in a semiconductor structure. The mask may be utilized, for example, to define emitters in a field emission display or spacers in a liquid crystal display.

5 Claims, 5 Drawing Sheets

METHOD OF PATTERNING A SEMICONDUCTOR DEVICE

BACKGROUND OF THE INVENTION

This invention relates generally to techniques for reproducibly transferring patterns to semiconductor devices and particularly to techniques which do not require the use of expensive steppers or the like. The techniques have applicability, for example, in connection with the formation of field emission displays.

In the manufacture of most modern semiconductor devices, a pattern is repeatedly transferred to a substrate using a device called a photolithographic stepper. The stepper is a highly precise machine which may use ultraviolet light to transfer an image formed on a glass plate called a reticle or mask to the semiconductor substrate. For example, the image may be transferred by shining light through the stepper reticle which has an enlarged version of the desired pattern formed on it. The light pattern created by the reticle pattern causes the photoresist to be exposed in the desired pattern. Photoresist can then be developed and etched depending on whether or not it was or was not exposed to light. The photoresist etches differently based on light exposure, and therefore the pattern formed on the reticle in the stepper can be accurately transferred to the substrate.

In many instances, it may be necessary to transfer a pattern reproducibly to a substrate, but the degree of precision enabled by modern stepper technology may not be absolutely required. Because higher resolution stepper equipment is extremely expensive especially for large substrates, it would be desirable to develop a process which allows patterns to be transferred without requiring the use of expensive stepper technology.

One such technique is described in an article by Y. Xia, D. Qin and G. Whitesides, "Microcontact Printing with a Cylindrical Rolling Stamp: A Practical Step Toward Automatic Manufacturing of Patterns with Submicrometer Sized Features," Adv. Mater. 1996, 8. No. 12, page 1015. The article describes a surface patterned rolling stamp which transfers ink to selected regions of the substrate surface in a non-random pattern. The ink may be an alkanethiolate printed on evaporated films of gold or silver. Selective wet etching in aqueous ferricyanide solution is utilized to form features in a silver or gold layer formed on a silicon substrate. While this technique may have promise, special materials and layers that may be relatively expensive are utilized.

Field emission displays are a type of flat panel display which may be useful as a display screen for a wide variety of electronic devices. For example, one potential application is to use the field emission display as a display screen for a laptop computer. This would mean that the field emission display would likely be formed on a relatively large substrate. But perhaps more importantly, to form a substrate of this size on a silicon wafer would be expensive. The expense arises as a function of the size of the wafer. Moreover, if photolitographic steppers were utilized to pattern such a large, specially configured substrate, special steppers would be required. This likely would mean additional expense as well.

Thus, there is a continuing need for a way to pattern semiconductors as cost effectively as possible. The need is particularly acute in connection with the fabrication of large field emission displays.

SUMMARY OF THE INVENTION

In accordance with one aspect, a method for forming a pattern on a semiconductor structure includes the step of dispersing a plurality of particles in a gas. The particles are collected on a semiconductor structure.

In accordance with still another aspect, a method for forming a pattern on a semiconductor structure includes the step of spraying a solution of particles and evaporating the solution. The particles are then collected in a randomly spaced distribution on the semiconductor structure.

In accordance with yet another aspect, a method of forming a semiconductor device includes the step of dispersing particles in a fluid. The particles are biased so as to space themselves from one another. The particles are collected in a randomly spaced distribution on a semiconductor structure.

In accordance with another aspect, a method of forming a semiconductor device includes the step of spraying a plurality of particles. The particles are caused to repel one another. The particles are then collected on a semiconductor structure.

In accordance with but another aspect, a method of forming a semiconductor device includes the step of forming a dispersion of particles. Agglomerated particles are separated from the dispersion and the dispersion is caused to collect on a semiconductor surface.

In accordance with still another aspect, a method of patterning a semiconductor structure includes the step of forming a gaseous dispersion of particles. The gaseous dispersion of particles is ionized and the particles are collected on a semiconductor structure.

In accordance with but another aspect, a method of forming a semiconductor device includes the step of forming a plurality of particles that are chemically charged. A dispersion of the particles is created and the particles are then collected on a semiconductor structure.

In accordance with yet another aspect, a method of forming a field emission display includes the step of forming a gaseous dispersion of particles. The particles are collected on the semiconductor structure. The particles are used as a mask for removing material from the structure. Emitters are defined in the structure and a screen is provided over the emitters.

In accordance with another aspect, a method of forming a liquid crystal display includes the step of creating a first liquid crystal retaining layer. A gaseous dispersion of particles is formed. The particles are collected on a first liquid crystal retaining layer. The particles are then covered with a second liquid crystal retaining layer.

In accordance with still another aspect, a method of patterning a semiconductor device includes the step of forming an aerosol from a liquid suspension of particles. The aerosol has droplets containing only one particle per droplet. The particles are collected on a semiconductor surface.

DESCRIPTION OF THE PREFERRED EMBODIMENTS

Figure 1:
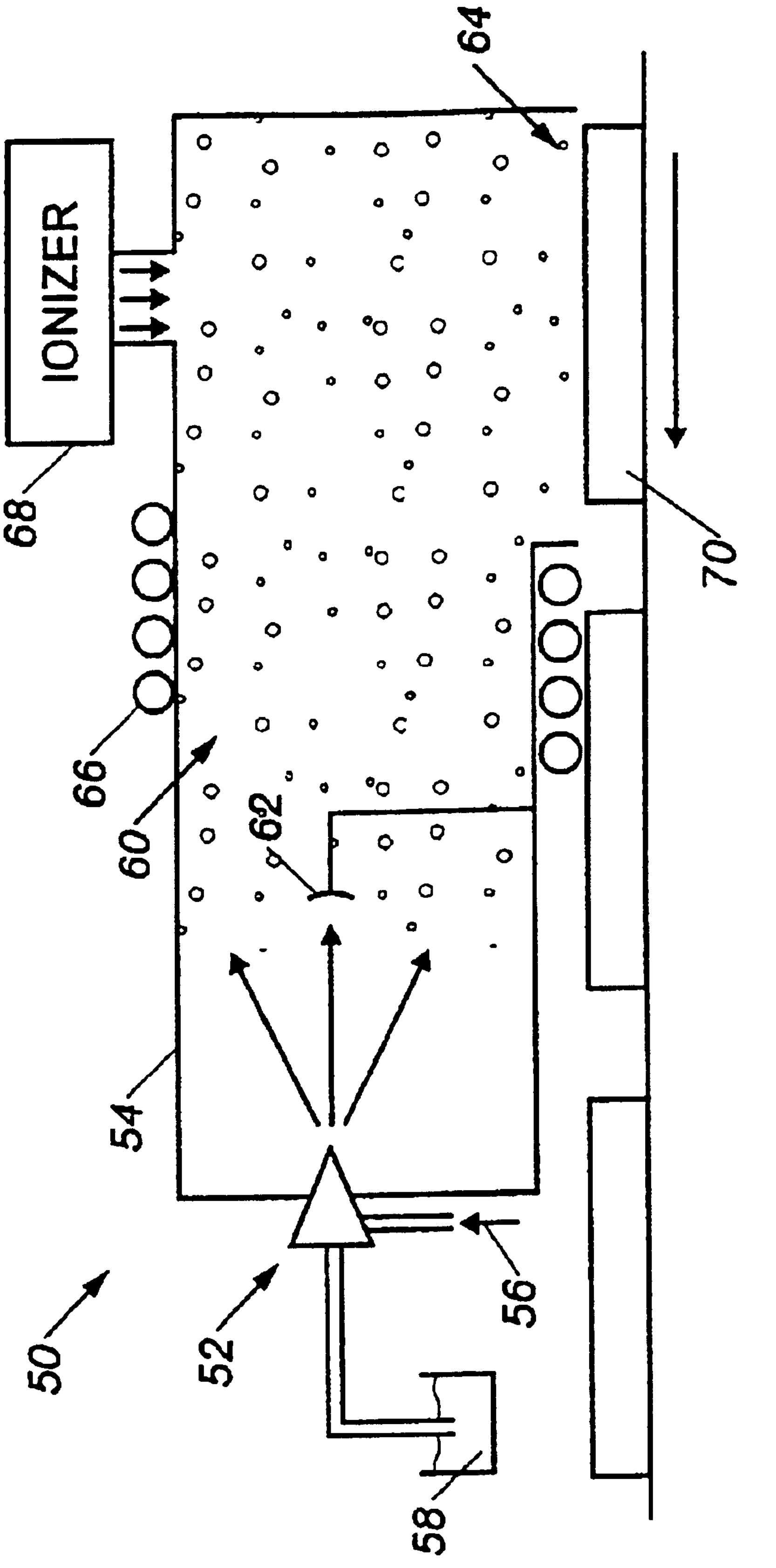
FIG. 1 is a schematic depiction of a deposition chamber for use in accordance with one embodiment of the present invention.

Referring to the drawing wherein like reference characters are used for like parts throughout the several views, a deposition chamber 50 includes a nebulizer 52 and a chamber 54. The term "nebulizer" as used herein, refers to a device for forming a gaseous dispersion or aerosol from a fluid suspension wherein the droplet size formed by the device is on the order of one to two microns. Advantageously, the nebulizer 52 disperses, in a gas, a plurality of droplets formed from a liquid suspension of collodial particles.

The nebulizer 52 is conveniently formed by a conventional venturi device. The venturi receives a flow of gas 56, which may be atmospheric air, and a liquid suspension 58. The liquid becomes entrained in the gas flow and is propelled outwardly in a gaseous dispersion or aerosol.

The particles in the suspension 58 may be microspheres formed of a variety of substances, including polymers, such as polystyrene, and silicon dioxide. Microspheres come in a variety of different sizes, but generally the microspheres are particles on the order of from 0.1 to 250 microns in diameter. The terms "microspheres" is intended to refer to small, generally spherical particles of colloidal particle size and not to any precise geometric shape. Suppliers for such microspheres includes Bangs Laboratories, Inc. in Fishers, Ind. 46038 and Interfacial Dynamics Corp. in Portland, Oreg. 97220.

The microspheres are conveniently suspended in an appropriate solution before being dispersed by the nebulizer 52. Conventionally, microspheres may be suspended in an isopropyl alcohol solution. However, it is generally advantageous in the present application to us a liquid which is highly volatile. Suitable liquids include ethanol, for example, in a solution of 98% ethanol and 2% water, and methanol in the same proportions.

The nebulizer 52 draws a continuous supply of the suspension 58 of microspheres, which are propelled by the input gas 56 to form a fine gaseous dispersion or aerosol of the particles. It is generally undesirable in the present application to have particle agglomeration. One way of preventing particle agglomeration is to collect agglomerated particles and remove them from the dispersion 60 inside the chamber 54. The agglomerated particles may be removed by using an impact bead 62 which is arranged directly in line with the axis of the nebulizer 52. Since agglomerated particles tend to be heavier, they exit the nebulizer substantially along its axis. The impact bead 62 then collects the agglomerated particles before they can effectively join the rest of the dispersion 60. Similarly, a plurality of baffles (not shown) may be utilized to collect agglomerated particles and to prevent them from flowing with the dispersion 60 to the dispersion outlet 64.

After passing the impact bead 62, the particle dispersion 60 is effectively a dispersed vapor cloud containing droplets on the order of approximately one to two microns in size. Where microspheres on this order are utilized, effectively one microsphere would be contained in each droplet together with the suspension 58 liquid. The liquid is easily and quickly evaporated if it is sufficiently volatile. However, a heater 66 may be configured about the chamber 54 to heat the dispersion 60 to drive the volatile liquid off of the particles.

The dried particle dispersion 60 may then be charged using a variety of techniques. For example, an ionizer 68 may be utilized to provide a gentle, downward stream of ionized gas. The ionized gas causes the particle dispersion 60 to be ionized. When the dispersion becomes ionized, the particles are all similarly charged and tend to repel one another. This forms a well dispersed gaseous suspension of particles. The goal is to create a dispersion of individual particles which are regularly spaced from one another.

A variety of other techniques may be used to provide an electrical charge on the particles to cause the particles to repel one another. For example, if polystyrene microspheres are utilized, they tend to build up electrical charges which are believed to be static electrical charges. These static electrical charges tend to repel the polystyrene microspheres from one another helping to form a finely dispersed dispersion. The microspheres may also be charged by using a spark discharge apparatus (not shown) to create an electrical charge in the dispersion 60, which is effective to charge the individual particles. Also, radio-active sources (not shown) may be utilized for charging the gas surrounding the particles, which in turn charges the particles.

In some applications it may be desirable to induce similar dipole moments on the various particles such that the particles tend to repel themselves. Another approach for causing the particles to repel one another is to chemically bias the particles with respect to one another. The particles are given a chemical charge such that they tend to be repelled from one another rather than being attracted to and reacting with one another. This may be done by creating free radicals using conventional techniques. These free radicals may be integral with the microspheres or they may be attached to the microspheres by surface modification techniques. Particles with bonded radical elements are available from the above-described suppliers. For example, particles which have surface modifications, for example, to include carboxylate ions, may be formed such that protons or hydrogen atoms are removed to create negatively chemically biased particles.

In some instances it may also be advantageous to mechanically agitate the particles to further increase their separation from one another. This may be done by sonication or by supplying various other forms of energy, including electromagnetic energy to the particles.

The particles forming the dispersion 60 eventually fall by the action of the ionizer 68 and normal gravitational forces through the opening 64 where they may be collected on a substrate 70, which is positioned in the opening 64 of the chamber 54. A plurality of substrates 70 of appropriate configurations may be caused to pass underneath the opening 64 to receive a deposition of microspheres. Advantageously, the dwell time of each substrate 70 is limited to prevent excessive piling up of particles. Ideally, a plurality of discrete particles, well spaced from one another, are formed on the substrate 70 without any closely adjacent particles.

Figure 2:
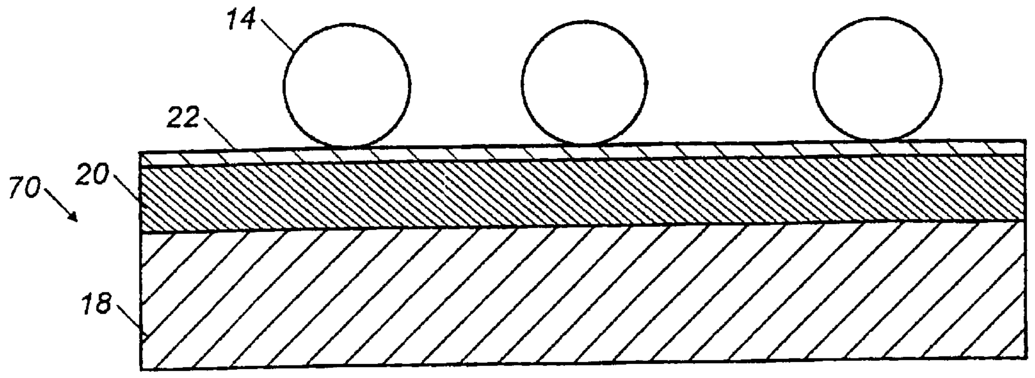
FIG. 2 is an enlarged cross-sectional view showing a plurality of microspheres having been deposited by the apparaus shown in FIG. 1 on a semiconductor structure.

Thus, the substrates 70 may be propelled past the opening 64 as indicated by the arrow in FIG. 1. As shown in FIG. 2, the substrates 70 receive a deposit of a plurality of microspheres 14 which may be randomly spaced from one another atop the substrate 70.

Figure 7:
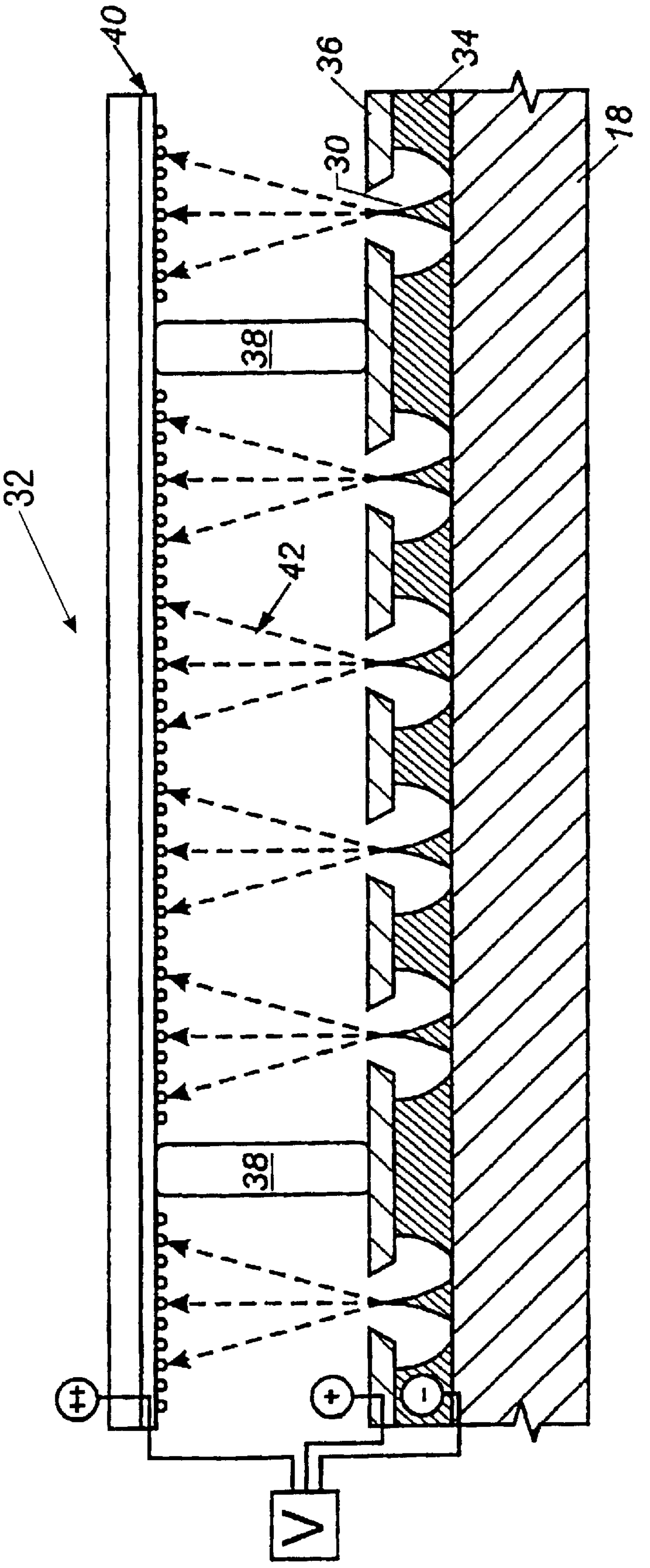
FIG. 7 is an enlarged cross-sectional view of a portion of a field emission display which could be formed in accordance with the techniques disclosed herein.
Figure 8:
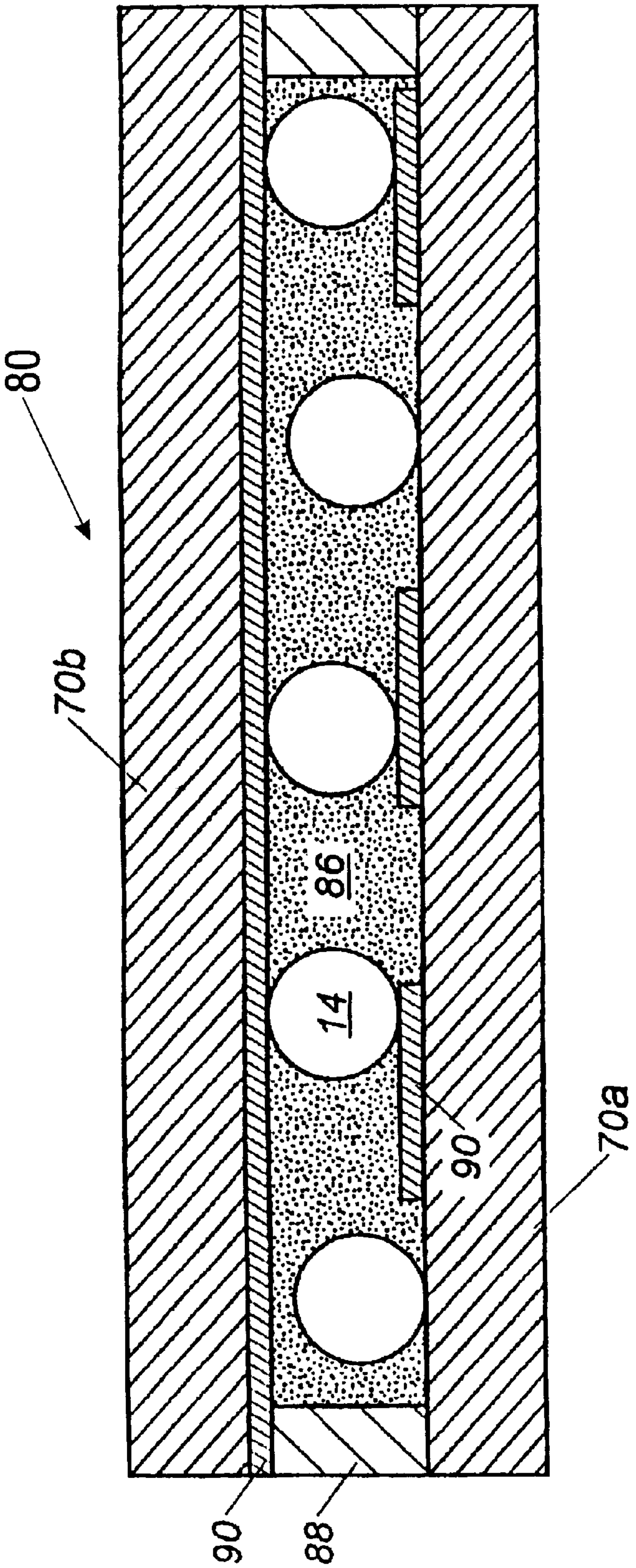
FIG. 8 is an enlarged cross-sectional view of a portion of a liquid crystal display formed in accordance with the techniques disclosed herein.

A variety of different substrates may be utilized in different applications in accordance with the present invention. For example, substrates may be formed of silicon wafers in order to form semiconductor devices, such as field emission displays. The substrate 70 may also be formed of appropriate glass materials with silicon deposited thereon also for purposes of forming field emission displays, as shown in FIG. 7. The substrate 70 may also be one utilized for forming a liquid crystal display wherein the substrate layer 70 forms a liquid crystal retaining layer and the microspheres 14 function as spacers between one layer 70*a* and an overlaying layer 70*b* as shown in FIG. 8.

The substrate illustrated in FIG. 2 includes a silicon layer 18, a polysilicon layer 20 and a dielectric layer 22. The dielectric layer 22 is advantageously a hard mask, the purpose of which will be explained hereinafter. The polysilicon 20 may be either doped or undoped polysilicon.

Figure 3:
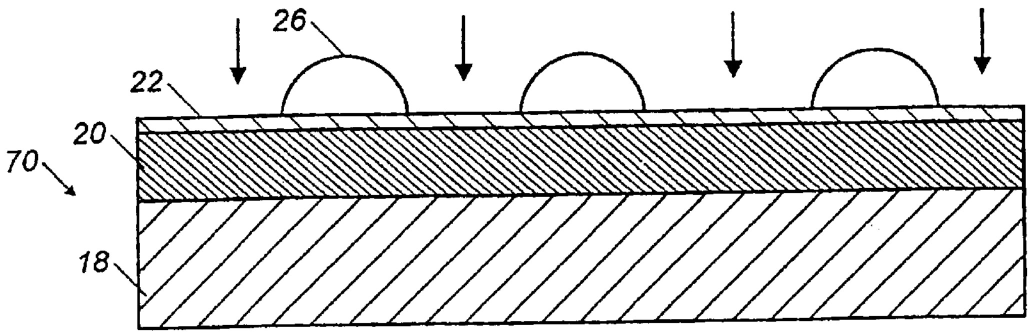
FIG. 3 is an enlarged cross-sectional view of the microspheres acting as an etching mask for an underlying hard mask.

Referring now to FIG. 3, the microspheres 14 may be melted to enhance their adherence to the substrate 70. However, in many instances, melting of the microspheres is unnecessary. In order to melt the microspheres, generally a low melting temperature material must be utilized, such as a polymer.

The structure shown in FIG. 3 is then exposed to an isotropic etch which is advantageously a plasma etch. Those skilled in the art can readily choose the most appropriate etcher for particular applications.

Figure 4:
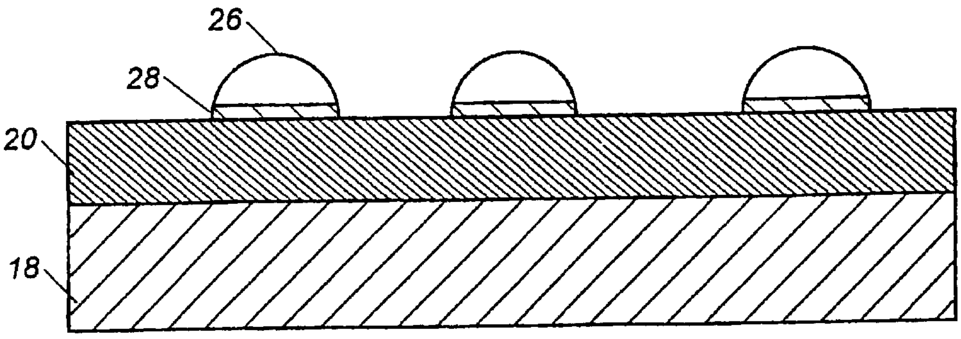
FIG. 4 is an enlarged cross-sectional view of the structure shown in FIG. 3 after the hard mask etching has been completed.

As a result of the etching step shown in FIG. 3, the hard mask 22 is etched away from all regions not covered by an overlaying hemisphere 26. This exposes the silicon layer 20 between adjacent etching masks formed of a hemisphere 26 and portion of the hard mask 28, as shown in FIG. 4. Any organic material covering the hard mask is removed prior to etching the underlying silicon layer.

Figure 5:
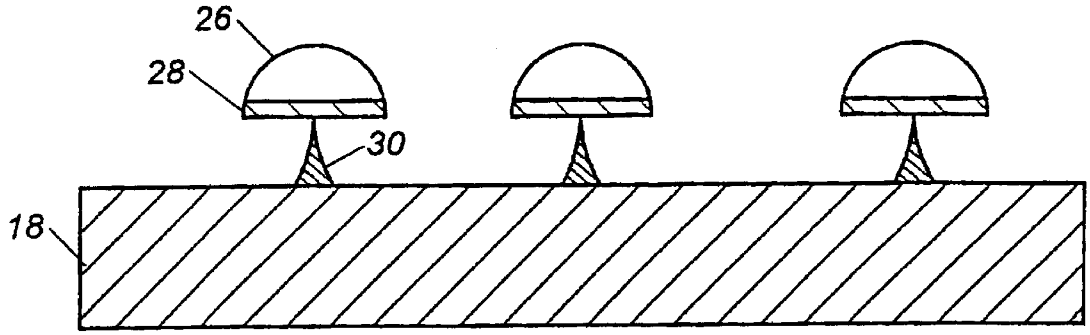
FIG. 5 is an enlarged cross-sectional view after the emitters have been etched.

Thereafter, the mask can be utilized to form additional features in the substrate 70. For example, etching techniques may be utilized to form conically shaped emitters 30, as shown in FIG. 5. The etching techniques used to form the structures are described in greater detail in U.S. Pat. No. 5,532,177 issued on Jul. 2, 1996 to David A. Cathey, hereby expressly incorporated by reference herein.

Figure 6:
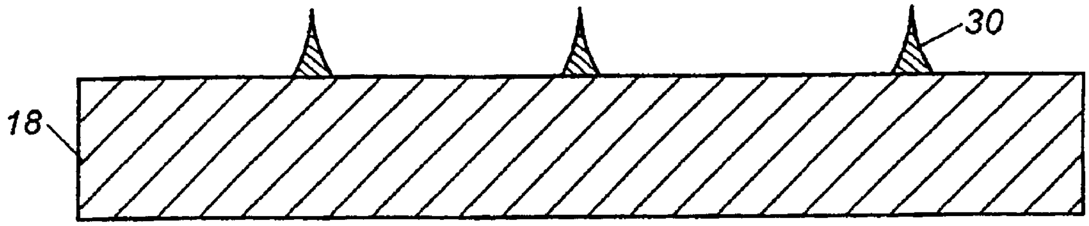
FIG. 6 is an enlarged cross-sectional view after the masking elements have been removed.

The emitters 30 may be etched by a variety of etching techniques with undercutting influenced by the doping concentration of the layer 20. Thereafter, the masking layer formed of the hemispheres 26 and dielectric remnants 28 may be removed using conventional wet etching techniques. The resulting emitters 30, shown in FIG. 6, may be sharpened using oxidation techniques as described in the aforementioned patent.

As shown in FIG. 7, the emitters 30 may be part of a field emission display 32. The field emission display 32 includes dielectric regions 34, an extractor 36, spacers 38, and a luminescent screen 40. Techniques for forming the field emission displays are described in U.S. Pat. Nos. 5,151,061, 5,186,670 and 5,210,472, hereby expressly incorporated by reference herein. The emitters 30 emit electrons 42, which charge the screen 40 and cause images to be seen by the user on the opposite side of the screen 40.

As shown in FIG. 8, the aerosol may be developed to create a random dispersion of particles 14 on a substrate 70 to act as spacers in a liquid crystal display 80. The particles 14 separate a pair of substrates 70*a* and 70*b* to maintain a consistent substrate spacing. A nematic liquid crystal 86 is also contained in the gap which is closed by seals 88. Electrodes 90 are provided on the facing surfaces of the substrates 70. Further details on liquid crystal displays can be found in U.S. Pat. No. 5,130,831, hereby expressly incorporated herein by reference.

With the techniques described herein, it is possible to form a variety of semiconductor devices without the necessity of using a stepper. The need for a dedicated stepper to support the manufacturing process is effectively eliminated. Moreover, because special steppers would be necessary for large substrates, the elimination of the need for the stepper can result in considerable cost savings.

With these techniques, the microspheres 14 can be utilized to form a mask which creates features on a semiconductor structure. The diameter and arrangement of the microspheres 14 corresponds to the resulting features formed in the semiconductor device. For example, microspheres on the order of about one to two microns may be used to form emitters of about one micron in diameter at their thickest point.

While the present invention has been described with respect to a limited number of preferred embodiments, those skilled in the art will appreciate numerous modifications and variations therefrom. It is intended that the appended claims cover all such modifications and variations as fall within the true spirit and scope of the present invention.

What is claimed is:

1. A method for forming a semiconductor device comprising the steps of:

forming a dispersion of particles;

separating, from said dispersion, agglomerated particles; and then causing the particles from said dispersion to collect on a semiconductor surface.

2. The method of claim 1 including the step of positioning an impact bead in front of said dispersion of particles and causing said impact bead to collect agglomerated particles.

3. The method of claim 1 including the step of nebulizing a liquid suspension of particles having diameters on the order of one to two microns.

4. The method of claim 3 including the step of propelling said particles outwardly from said nebulizer such that agglomerated groups of particles have a different mass than discrete separated particles.

5. The method of claim 4 including the step of using the different mass of agglomerated particles to separate said agglomerated particles from the dispersion containing only discrete individual particles.

* * * * *